| United States Patent [19] | [11] Patent Number: 5,043,231 |
| Miyazawa et al. | [45] Date of Patent: Aug. 27, 1991 |

[54] GADOLINIUM-LUTETIUM-GALLIUM GARNET CRYSTAL, PROCESS FOR ITS PRODUCTION AND SUBSTRATE FOR MAGNETO-OPTICAL DEVICE MADE THEREOF

[75] Inventors: Yasuto Miyazawa, Tsukuba; Nobuhiro Kodama, Yokohama; Kouichi Koudu, Hachioji; Shin-ichi Hanita, Tsukuba; Hiroaki Toshima, Inashiki; Shigeyuki Kimura, Tsukuba, all of Japan

[73] Assignee: National Institute for Research in Inorganic Materials, Tsukuba, Japan

[21] Appl. No.: 429,455

[22] Filed: Oct. 31, 1989

[30] Foreign Application Priority Data

Nov. 4, 1988 [JP] Japan ................. 63-279080
Nov. 4, 1988 [JP] Japan ................. 63-279081

[51] Int. Cl.$^5$ .............................................. B32B 7/00
[52] U.S. Cl. .................................... 428/700; 428/701; 428/702; 428/900; 423/263; 350/375; 350/378
[58] Field of Search ............... 423/263; 428/694, 900, 428/700, 701, 702; 350/375, 378

[56] References Cited

U.S. PATENT DOCUMENTS

| 4,379,853 | 4/1983 | Mateika et al. | 428/700 |
| 4,454,206 | 6/1984 | Mateika et al. | 428/700 |
| 4,544,239 | 10/1985 | Shone et al. | 428/701 |
| 4,581,579 | 4/1986 | Nagatsuma et al. | 350/375 |
| 4,604,577 | 8/1986 | Matsumura et al. | 350/378 |
| 4,622,264 | 11/1986 | Hosoe et al. | 428/701 |
| 4,698,281 | 10/1987 | Armand et al. | 428/700 |
| 4,728,178 | 3/1988 | Gualtieri et al. | 428/700 |

FOREIGN PATENT DOCUMENTS 149055 3/1987 Japan .

*Primary Examiner*—Merrell C. Cashion, Jr.
*Assistant Examiner*—Dennis V. Carmen
*Attorney, Agent, or Firm*—Oblon, Spivak, McClelland, Maier & Neustadt

[57] ABSTRACT

A gadolinium-lutetium-gallium garnet crystal having the formula:

$$(Gd_{1-x}Lu_x)_3(Gd_yLu_zGa_{1-y-z})_2Ga_3O_{12} \qquad (I)$$

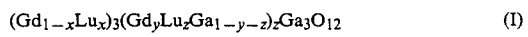

wherein x, y and z are number satisfying $0 \leq x \leq 0.4$, $0 \leq y \leq 0.05$ and $0.6 \leq z \leq 1.0$, respectively.

6 Claims, No Drawings

GADOLINIUM-LUTETIUM-GALLIUM GARNET CRYSTAL, PROCESS FOR ITS PRODUCTION AND SUBSTRATE FOR MAGNETO-OPTICAL DEVICE MADE THEREOF

BACKGROUND OF THE INVENTION

1. Field of the Invention

The present invention relates to a garnet crystal having a new composition useful as a single crystal substrate for a magneto-optical device or for a photothermal magnetic recording medium or as a host crystal for incorporating a transition metal or rare earth element constituting a luminescent center. Further, the present invention relates to a process for producing such a garnet crystal and a substrate for a magneto-optical device material useful as an optical isolator, an optical switch or an optical deflector.

2. Discussion of Background

A garnet crystal has three different atomic occupying sites of dodecahedron octacoodination, octahedron hexacoodination and tetrahedron tetracoodination. Heretofore, as garnet crystals with the dodecahedron octacoodination site occupied by gadolinium and the tetrahedron tetracoodination site occupied by gallium, a gadolinium-gallium garnet crystal ($Gd_3Ga_5O_{12}$) and a gadolinium-scandium-gallium garnet crystal ($Gd_3Sc_2Ga_3O_{12}$) are known. These conventional garnet crystals have a lattice constant within a range of from 12.38 to 12.56 Å. When they are used as a single crystal substrate for a magneto-optical device or for a photothermal magnetic recording medium, or as a host crystal to widen the emission range, it has been difficult to obtain a good magneto-optical device, etc., since their lattice constants are rather small.

A magneto-optical device is known wherein a neodium-gallium garnet crystal, a gadolinium-gallium garnet crystal or a gadolinium-scandium-gallium garnet crystal is used as a substrate, and a film of a bismuth-substituted rare earth iron garnet crystal of the formula $(Bi_{1-x-y}R_xR'_y)_3Fe_5O_{12}$ wherein x and y are numbers satisfying $0 \leq x \leq 0.7$ and $0 \leq y \leq 0.7$, respectively, and each of R and R' is a rare earth element such as Y, Sc, La, Ce, Nd, Sm, Eu, Gd, Tb, Dy, Ho, Er, Tm, Yb or Lu, is used as a magneto-optical thin film on the substrate. For the formation of the magneto-optical crystal layer on the substrate, a sputtering method, a vapor phase epitaxial method or a liquid phase epitaxial method is used to let a magneto-optical crystal grow on the substrate. In such a case, in order to minimize defects or rearrangement of the crystal growing in a film form, it is necessary that the lattice constants of the grown thin film crystal and the substrate crystal be as close to each other as possible. Further, in order to obtain a magneto-optical device having excellent magneto-optical effects, it is necessary to use a grown crystal having a Faraday rotation angle as large as possible. The Faraday rotation angle and the lattice constant of the bismuth-substituted rare earth iron garnet crystal increase in proportion to the amount of substitution by bismuth. The lattice constant of the bismuth iron garnet crystal substituted completely by bismuth and having the largest Faraday rotation angle, is estimated as 12.62 A. Whereas, the lattice constants of a gadolinium-gallium garnet crystal, a neodium-gallium garnet crystal and a gadolinium-scandium-gallium garnet crystal are smaller at levels of 12.38 A, 12.51 A and 12.56 A, respectively. Accordingly, with the above-mentioned conventional magneto-optical device, if it is attempted to improve the magneto-optical effects of a bismuth-substituted rare earth iron garnet crystal by increasing the amount of substitution by bismuth, mismatching of lattices will be brought about between the film-forming crystal and the substrate crystal, whereby rearrangement or cracking is likely to result in the formed crystal, and it is difficult to obtain a product having good magneto-optical effects.

SUMMARY OF THE INVENTION

It is an object of the present invention to solve the above-mentioned problems and to provide a garnet crystal having a lattice constant larger than that of the conventional gadolinium-gallium or gadolinium-scandium-gallium garnet crystal.

Another object of the present invention is to provide a substrate for a magneto-optical device, which is free from lattice mismatching when used as a substrate for a magneto-optical device in combination with a bismuth-substituted rare earth iron garnet crystal with a large amount of bismuth substitution, as the magneto-optical crystal layer.

The present invention provides a gadolinium-lutetium-gallium garnet crystal having the formula:

$$(Gd_{1-x}Lu_x)_3(Gd_yLu_zGa_{1-y-z})_zGa_3O_{12} \qquad (I)$$
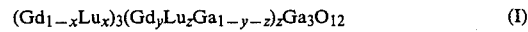

wherein x, y and z are numbers satisfying $0 \leq x \leq 0.4$, $0 \leq y \leq 0.05$ and $0.6 \leq z \leq 1.0$, respectively.

The present invention also provides a substrate for a magneto-optical device, which is made of the garnet crystal of the formula I as defined above.

Further, the present invention provides a process for producing a garnet crystal of the formula I as defined above, which comprises thoroughly mixing oxides of gadolinium, lutetium and gallium in an atomic ratio of $Gd:Lu:Ga = \{3(1-x)+2y\}:(3x+2z):\{2(1-y-z)+3\}$ wherein x, y and z are numbers satisfying $0 \leq x \leq 0.4$, $0 \leq y \leq 0.05$ and $0.6 \leq z \leq 1.0$, respectively, then melting the mixture in an inert or oxidizing gas atmosphere and solidifying the melt to obtain the crystal. This process is particularly suitable for the production of a substrate for a magneto-optical device made of the garnet crystal of the formula I. For the process of the present invention, a floating zone method, a Czochralski method or a Bridgeman method may be employed to obtain the crystal by melting the mixture of gadolinium oxide ($Gd_2O_3$), lutetium oxide ($Lu_2O_3$) and gallium oxide ($Ga_2O_3$) in the predetermined ratio in an inert or oxidizing gas atmosphere and solidifying the melt.

DETAILED DESCRIPTION OF THE PREFERRED EMBODIMENTS

The garnet crystal of the present invention is obtainable in the form of a single crystal of a single phase having a lattice constant larger than that of conventional garnet crystals. Such a garnet crystal is free from lattice mismatching with a bismuth-substituted rare earth iron garnet crystal having a large amount of bismuth substitution. Therefore, it is suitable for use as a substrate for a magneto-optical device material having the magneto-optical effects improved by using such a bismuth-substituted rare earth iron garnet crystal as a film-forming crystal.

Now, the present invention will be described in further detail with reference to Examples. However, it should be understood that the present invention is by no means restricted by such specific Examples.

EXAMPLE 1

Oxides of gadolinium, lutetium and gallium were mixed in an atomic ratio of Gd:Lu:Ga=2.4:2.3:3.3, and the mixture thus obtained was put in an iridiuum crucible. Then, a crystal was grown by a Czochralski method in a nitrogen atmosphere containing 1.5% by volume of oxygen at a rotational speed of a seed crystal of 20 rpm at a pulling speed of 3.0 mm/hr. The crystal thus obtained was ascertained to be a garnet crystal having a composition of the formula $Gd_{2.20}Lu_{2.41}Ga_{3.39}O_{12}$ with a lattice constant a=12.60 A, by the X-ray diffraction and elemental analysis.

EXAMPLE 2

Oxides of gadolinium, lutetium and gallium were mixed in an atomic ratio of Gd:Lu:Ga=2.6:2.0:3.4, and the mixture thus obtained was used as a starting material. A crystal was grown by a floating zone method in a nitrogen atmosphere containing 20% by volume of oxygen at a rotational speed of the starting material rod and seed crystal of 30 rpm and a zone transfer speed of 3.0 mm/hr. The crystal thus obtained was a garnet crystal having a composition of the formula $Gd_{2.36}Lu_{2.23}Ga_{3.41}O_{12}$ with a lattice constant a=12.61 A.

EXAMPLE 3

Oxides of gadolinium, lutetium and gallium were mixed in an atomic ratio of Gd:Lu:Ga=3.0:1.6:3.4, and the mixture thereby obtained was subjected to solid reaction according to a conventional method to prepare a crystal. The crystal thus obtained was ascertained to have a garnet single phase and a lattice constant a=12.64 A by the X-ray diffraction.

EXAMPLE 4

Oxides of gadolinium, lutetium and gallium were mixed in an atomic ratio of Gd:Lu:Ga=2.41:2.3:3.3, and the mixture thereby obtained was subjected to melt-solidification in accordance with a conventional method to prepare a crystal. The crystal thus obtained was ascertained also to have a single phase and a lattice constant a=12.60 A by the X-ray diffraction.

The garnet crystal having a new composition according to the present invention has a lattice constant larger than that of the conventional gadolinium-gallium or gadolinium-scandium-gallium garnet crystal and thus is very useful as a single crystal substrate for a magneto-optical device or for a photothermal magnetic recording medium, or as a luminescent material.

More specifically, the garnet crystal having the new composition obtained by the process of the present invention has a lattice constant larger than that of a gadolinium-gallium garnet crystal (a=12.38 A), a neodium-gallium garnet crystal (a=12.51 A) and a gadolinium-scandium-gallium garnet crystal (a=12.56 A) used as a substrate in a conventional magneto-optical device, and the lattice constant is close to the lattice constant (12.62 A) of the bismuth-iron garnet crystal ($Bi_3Fe_5O_{12}$) having the largest Faraday rotation angle. Therefore, when used as a substrate for a magneto-optical device wherein a bismuth-substituted rare earth iron garnet crystal having such a large amount of bismuth substitution is used as a magneto-optical crystal layer, it does not bring about a trouble of lattice mismatching. Thus, it makes it possible to obtain a magneto-optical device having excellent magneto-optical effects, which is useful as an optical isolator, an optical switch or an optical deflector.

What is claimed is:

1. A gadolinium-lutetium-gallium garnet crystal having the formula:

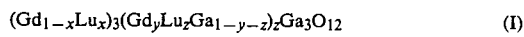

$$(Gd_{1-x}Lu_x)_3(Gd_yLu_zGa_{1-y-z})_2Ga_3O_{12} \qquad (I)$$

wherein x, y and z are numbers satisfying $0 \leq x \leq 0.4$, $0 \leq y \leq 0.05$ and $0.6 \leq z \leq 1.0$, respectively.

2. The garnet crystal according to claim 1, which has a lattice constant of at least 12.58 A.

3. The garnet crystal according to claim 1, which has a lattice constant of at least 12.60 A.

4. A substrate for a magneto-optical device, which is made of the garnet crystal as defined in claim 1.

5. The substrate according to claim 4, having a magneto-optical thin film layer of a bismuth-substituted rare earth iron garnet of the formula:

$$(Bi_{1-x-y}R_xR'_y)_3Fe_5O_{12} \qquad (II)$$

wherein x and y are numbers satisfying $0 \leq x \leq 0.7$ and $0 \leq y \leq 0.7$, respectively, and each of R and R' is a rare earth element selected from the group consisting of Y, Sc, La, Ce, Nd, Sm, Eu, Gd, Tb, Dy, Ho, Er, Tm, Yb and Lu, formed thereon.

6. A process for producing a garnet crystal as defined in claim 1, which comprises thoroughly mixing oxides of gadolinium, lutetium and gallium in an atomic ratio of Gd:Lu:Ga={3(1−x)+2y}:(3x+2z):{2(1−y−z)+3} wherein x, y and z are numbers satisfying $0 \leq x \leq 0.4$, $0 \leq y \leq 0.05$ and $0.6 \leq z \leq 1.0$, respectively, then melting the mixture in an inert or oxidizing gas atmosphere and solidifying the melt to obtain the crystal.

* * * * *